(12) United States Patent
Weiss et al.

(10) Patent No.: US 9,182,621 B2
(45) Date of Patent: Nov. 10, 2015

(54) ELECTRONIC DISPLAYS USING OPTICALLY PUMPED LUMINESCENT SEMICONDUCTOR NANOCRYSTALS

(71) Applicant: THE REGENTS OF THE UNIVERSITY OF CALIFORNIA, Oakland, CA (US)

(72) Inventors: Shimon Weiss, Pinole, CA (US); Michael C. Schlamp, Plainsboro, NJ (US); A. Paul Alivisatos, Oakland, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/629,808

(22) Filed: Feb. 24, 2015

(65) Prior Publication Data

US 2015/0177560 A1    Jun. 25, 2015

Related U.S. Application Data

(60) Division of application No. 14/223,890, filed on Mar. 24, 2014, now Pat. No. 9,063,363, which is a continuation of application No. 13/215,520, filed on Aug. 23, 2011, now Pat. No. 8,678,871, which is a division of application No. 12/471,889, filed on May 26, 2009, now Pat. No. 8,026,661, which is a continuation of application No. 11/701,879, filed on Feb. 2, 2007, now Pat. No. 7,696,684, which is a continuation of application No. 11/040,318, filed on Jan. 20, 2005, now abandoned, which is a continuation of application No. 09/324,149, filed on Jun. 2, 1999, now Pat. No. 6,864,626.

(60) Provisional application No. 60/087,883, filed on Jun. 3, 1998.

(51) Int. Cl.
| | | |
|---|---|---|
| H01J 9/00 | (2006.01) | |
| H01J 9/24 | (2006.01) | |
| G02F 1/1333 | (2006.01) | |
| B82Y 20/00 | (2011.01) | |
| B82Y 30/00 | (2011.01) | |
| G02F 1/1335 | (2006.01) | |
| H01L 27/32 | (2006.01) | |
| H01L 51/50 | (2006.01) | |

(52) U.S. Cl.
CPC ........... *G02F 1/133362* (2013.01); *B82Y 20/00* (2013.01); *B82Y 30/00* (2013.01); *G02F 1/1333* (2013.01); *G02F 1/133509* (2013.01); *G02F 1/133617* (2013.01); *H01L 27/3211* (2013.01); *H01L 51/5012* (2013.01); *G02F 2202/36* (2013.01); *H01L 2251/5369* (2013.01)

(58) Field of Classification Search
CPC ...... H05B 33/14; H05B 33/20; H05B 33/145; H01J 29/20; H01J 1/63; H01J 63/04; H01J 61/38; B82Y 20/00; B82Y 30/00; G02F 1/135; G02F 1/1333; G02F 1/133509
USPC ................. 313/485, 486, 467, 468, 496, 503; 252/586, 588; 345/84–86, 107, 108; 445/23–25

See application file for complete search history.

(56) References Cited

U.S. PATENT DOCUMENTS

| | | |
|---|---|---|
| 4,092,301 A | 5/1978 | Russo et al. |
| 4,481,354 A | 11/1984 | Curatolo et al. |

(Continued)

*Primary Examiner* — Thomas A Hollweg
*Assistant Examiner* — Kevin Quarterman
(74) *Attorney, Agent, or Firm* — Knobbe Martens Olson & Bear, LLP

(57) ABSTRACT

A multicolor electronic display is based on an array of luminescent semiconductor nanocrystals. Nanocrystals which emit tight of different colors are grouped into pixels. The nanocrystals are optically pumped to produce a multicolor display. Different sized nanocrystals are used to produce the different colors. A variety of pixel addressing systems can be used.

28 Claims, 6 Drawing Sheets

(56) References Cited

U.S. PATENT DOCUMENTS

| | | |
|---|---|---|
| 4,588,797 A | 5/1986 | Curatolo et al. |
| 4,619,962 A | 10/1986 | Sato |
| 5,212,426 A | 5/1993 | Kane |
| 5,422,489 A | 6/1995 | Bhargava |
| 5,442,254 A | 8/1995 | Jaskie |
| 5,455,489 A | 10/1995 | Bhargava |
| 5,537,000 A | 7/1996 | Alivisatos et al. |
| 5,559,822 A | 9/1996 | Pankove et al. |
| 5,856,814 A | 1/1999 | Yagyu |
| 5,952,665 A | 9/1999 | Bhargava |
| 6,028,835 A | 2/2000 | Thomas |
| 6,157,047 A | 12/2000 | Fujita et al. |
| 6,270,883 B1 | 8/2001 | Sears et al. |
| 6,322,901 B1 | 11/2001 | Bawendi et al. |
| 6,608,439 B1 | 8/2003 | Sokolik et al. |
| 6,861,155 B2 | 3/2005 | Bawendi et al. |
| 6,864,626 B1 | 3/2005 | Weiss et al. |
| 7,696,684 B2 | 4/2010 | Weiss et al. |
| 2002/0000683 A1 | 1/2002 | Sears et al. |

ELECTRONIC DISPLAYS USING OPTICALLY PUMPED LUMINESCENT SEMICONDUCTOR NANOCRYSTALS

This invention was made with U.S. Government support under Contract No. DE-AC03-76SF0098 between the U.S. Department of Energy and the University of California for the operation of LAWRENCE BERKELEY NATIONAL LABORATORY (LBNL). The U.S. Government may have certain rights to this invention.

BACKGROUND OF THE INVENTION

1. Field of the Invention

This invention relates generally to electronic displays and more particularly to multi-color electronic displays based on luminescent semiconductor nanocrystals.

2. Description of the Related Art

Flat panel display technologies are currently displacing cathode ray tube (CRT) displays. CRT's main disadvantages are volume, weight and power consumption. On the other hand, CRT's image quality, resolution, and color are still unsurpassed. An alternative technology, which has already made it to the market, is that of liquid crystal displays (LCDs).

In liquid crystal displays, an image is produced by turning "on" or "off" pixels by selectively passing or blocking light from a backlight. This is done with the help of sheet polarizers and by controlling the polarization state of the light as it traverses the liquid crystal. In a color display, each screen pixel is actually made of three separate dots, each with a respective red, green, or blue filter printed on the glass in front of it (a fourth white dot may also be included to adjust contrast). These three primary colors are mixed in various amounts to form the variety of colors the user sees. Since the backlight is unpolarized and its spectrum is broad, a considerable amount of light is dissipated on the sheet polarizers and color filters, making these displays energy inefficient.

Other important flat panel display technologies which are currently being developed are field emitters, plasma displays and multi-color semiconductors and polymeric light emitting diodes based on electroluminescence and/or optical pumping.

A nanocrystal (or nanometer crystal) is an organic or inorganic single crystal particle having an average cross-section no larger than about 20 nm (200 Angstroms), and preferably no larger than about 10 nm (100 A) and a minimum average cross-section of about 1 nm or in some instances even a smaller average cross-section, i.e. down to about 0.5 nm (5 A). Typically the nanocrystals will have an average cross-section ranging in size from about 1 nm (10 A) to about 10 nm (100 A). A semiconductor nanocrystal is a nanocrystal of group II-VI (e.g. CdS, CdSe, CdTe, ZnS, ZnSe, ZnTe), or group III-V (e.g. GaAs, InAs, InGaAs, InP) semiconductor compounds. Also included are group IV semiconductors such as silicon or germanium, and organic semiconductors. Nanocrystals are capable of emitting electromagnetic radiation upon excitation. The color of the emitted light depends on the size of the crystal and the material. The larger the crystal, the more red the output, and the wider the emission band. Nanocrystals generally have narrow emission bands, i.e. the wavelength band of emission does not exceed about 40 nm in the visible and preferably does not exceed about 20 nm. The width of the emission band scales with energy, not wavelength. Nanocrystals also generally have a broad absorption band, i.e. the electromagnetic radiation absorption continuously increases from the onset which occurs near to but at slightly higher energy than the emission band.

The growth of core/shell semiconductor nanocrystals is described in Xiaogang Peng et al., "Epitaxial Growth of Highly Luminescent CdSe/CdS Core/Shell Nanocrystals with Photostability and Electronic Accessibility," J. Am. Chem. Soc. 1997, 119, 7019-7029. U.S. Pat. No. 5,505,928 to Alivisatos et al. describes the preparation of III-V semiconductor nanocrystals. U.S. Pat. No. 5,262,357 to Alivisatos et al. describes formation of thin films from nanocrystal precursors. U.S. Pat. No. 5,751,018 to Alivisatos et al. describes the bonding of semiconductor nanocrystals to solid surfaces.

U.S. Pat. No. 5,537,000 to Alivisatos et al. describes an electroluminescent device having an electron transport layer of semiconductor nanocrystals. The device has a hole injection layer, a hole transport layer, the nanocrystal electron transport layer, and an electron injection layer. Device output color is controlled by voltage as well as nanocrystal size and type. A flat panel display is produced from an array of the electroluminescent devices.

The use of luminescent semiconductor nanocrystals in biological probes is described in U.S. patent application Ser. No. 08/978,450.

SUMMARY OF THE INVENTION

The invention is a multi-color electronic display which utilizes arrays of luminescent semiconductor nanocrystals for pixel elements. Each pixel or addressable color element is formed of a number of suitably sized nanocrystals to produce a desired color. While the display can be based on the three primary colors, red, green and blue, greater flexibility in using many more different colors by selecting suitably sized nanocrystals to produce different colors is possible. In addition to the pixel array formed of the nanocrystals, the display includes a pixel addressing (including optical pumping) system. In one illustrative embodiment, a backlight source with a pixelated array of elements is used. In a second illustrative embodiment, a liquid crystal modulator is used to modulate a backlight. In a third illustrative embodiment, a modulated laser is raster scanned over the pixel array. Light of a single wavelength can be used to excite the nanocrystals of all colors. Ultraviolet or blue light sources are preferred. If UV backlight is used, all the pixels contain the appropriate sized nanocrystals; however, if blue excitation is used, then the blue pixels can contain no nanocrystals and merely pass the backlight directly. A long-pass filter having the appropriate wavelength typically covers the pixel array.

DETAILED DESCRIPTION OF INVENTION

The invention comprises a color display which is based on the luminescence phenomena in semiconductor nanocrystals. It takes advantage of the following properties: (1) color tunability of the luminescence is obtained by quantum confinement through size control; (2) the luminescence of such nanocrystals is very narrow, i.e. spectrally pure; (3) the luminescence quantum efficiency of core-shell nanocrystals is very high; (4) the nanocrystals are photostable; (5) the absorption lineshape of the nanocrystals continues above an onset (which depends on particle size). Therefore, the luminescent semiconductor nanocrystals are capable of being excited over a broad bandwidth, yet exhibit emission in a narrow wavelength band. Thus, UV or blue light (UV/blue) as well as other color light may be used to excite different size nanocrystals with different emission spectra. For example, the same UV/blue light can be used to excite blue, red and green pixels to get the three needed primary RGB display colors with a single excitation source. Alternatively, nanocrystals with any other colors can be used. More than just three colors can be used, i.e. any number of display colors, e.g. 25, could be used. While the invention is described primarily with reference to RGB pixels illuminated by UV or blue light, the principles of the invention apply to any color nanocrystals illuminated by any suitable color source.

As used herein, the term pixel refers to an independently addressable single color element, i.e. a group of red emitting nanocrystals which form a red color element on the display are referred to as a red pixel. The term pixel could be used to describe a combined element including a color element of each of the colors, e.g. a pixel with red, green and blue dots or subpixel elements. However, since each of the color elements must be separately addressable, it is simpler to refer to each color element as a pixel.

Figure 1A:
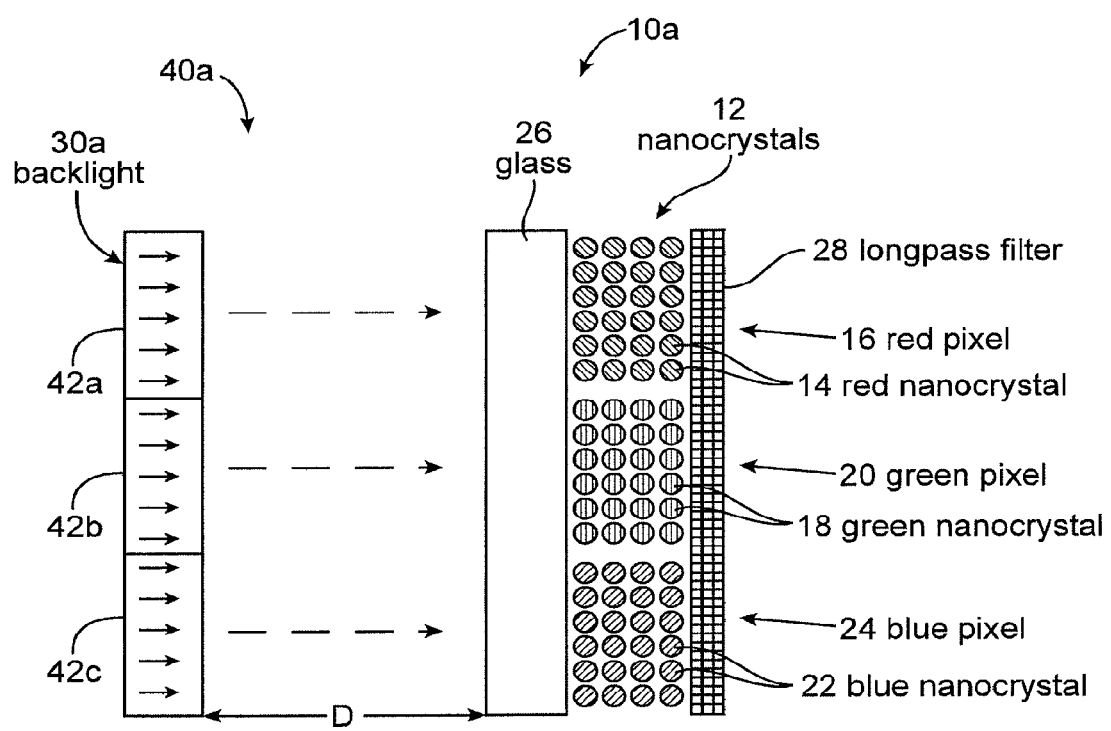
FIGS. 1A-G are simplified cross-sectional views of different embodiments of an optically pumped luminescent semiconductor nanocrystal based electronic display with three types of pixel addressing systems.
Figure 1B:
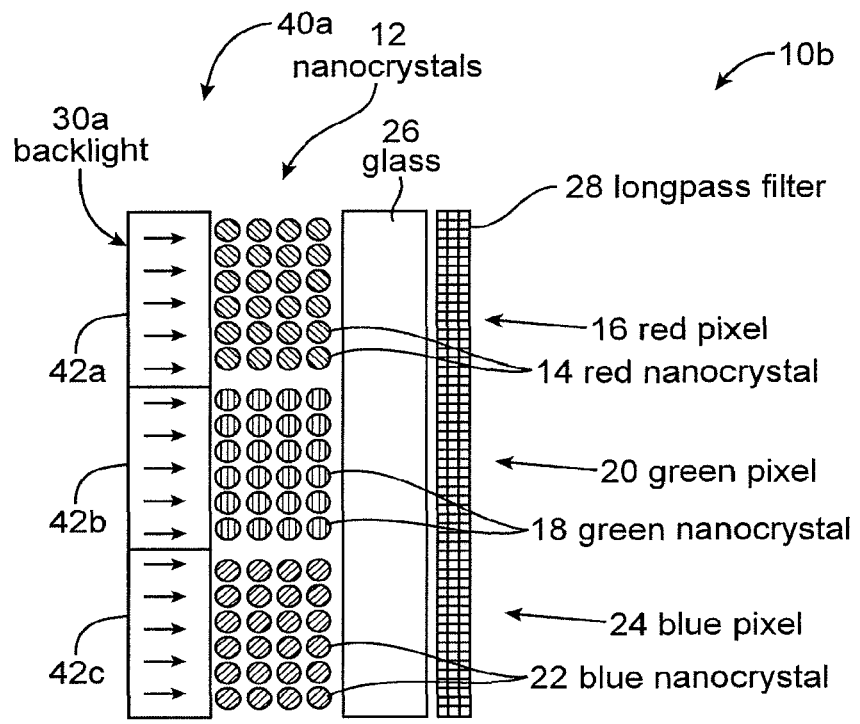
Figure 1C:
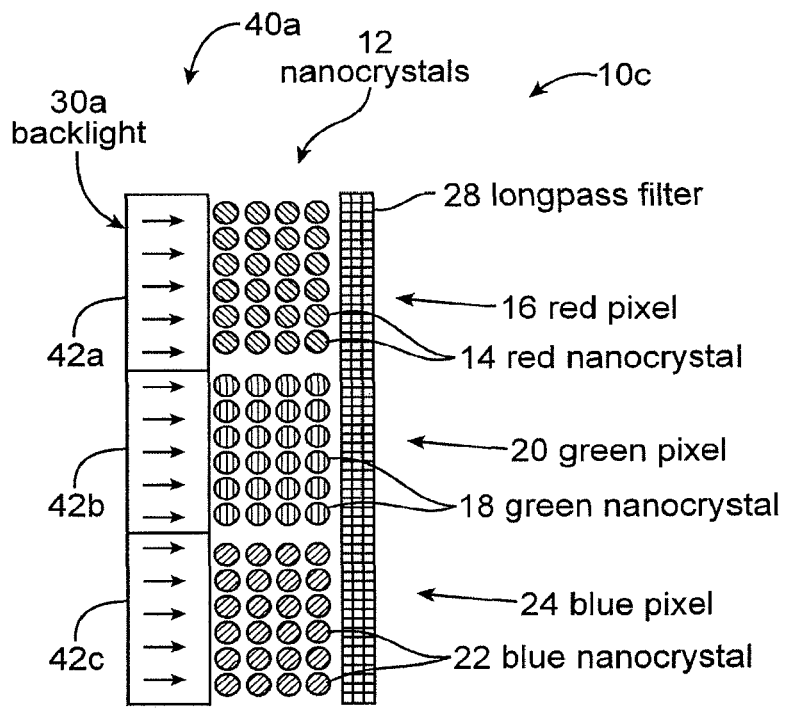
Figure 1D:
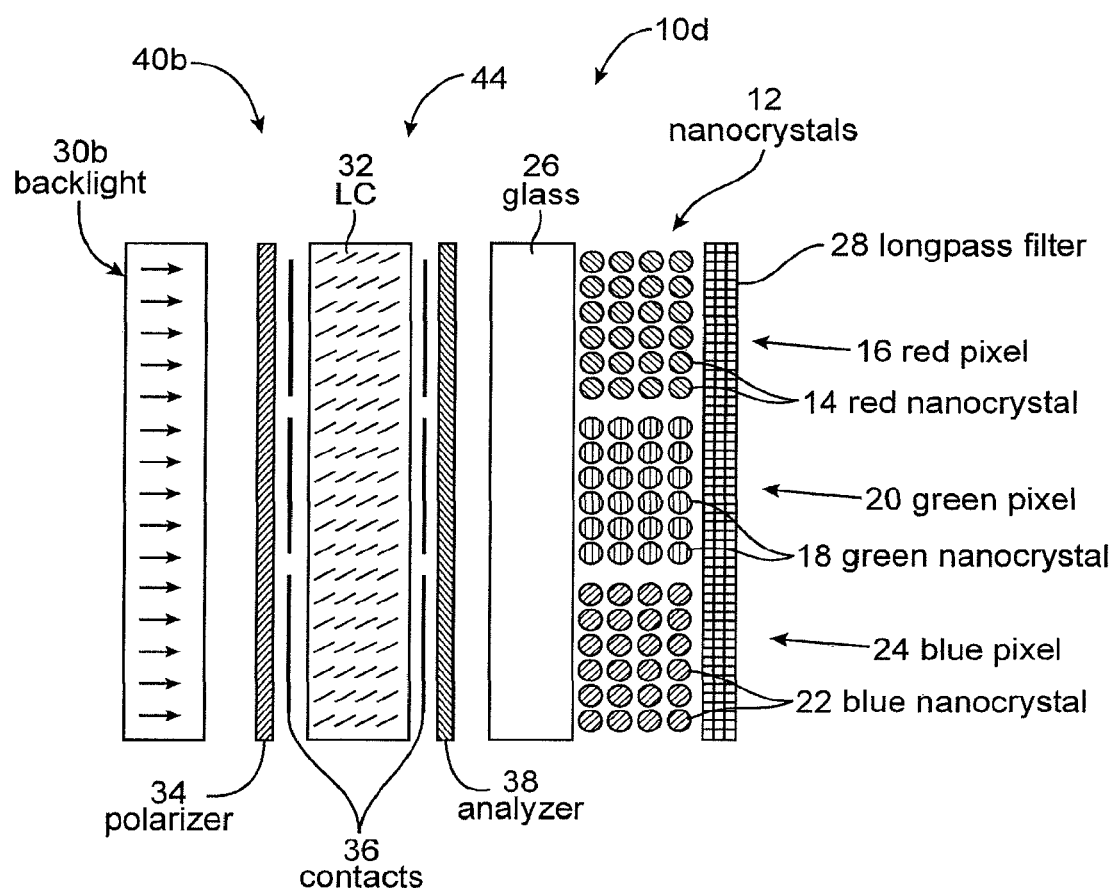
Figure 1E:
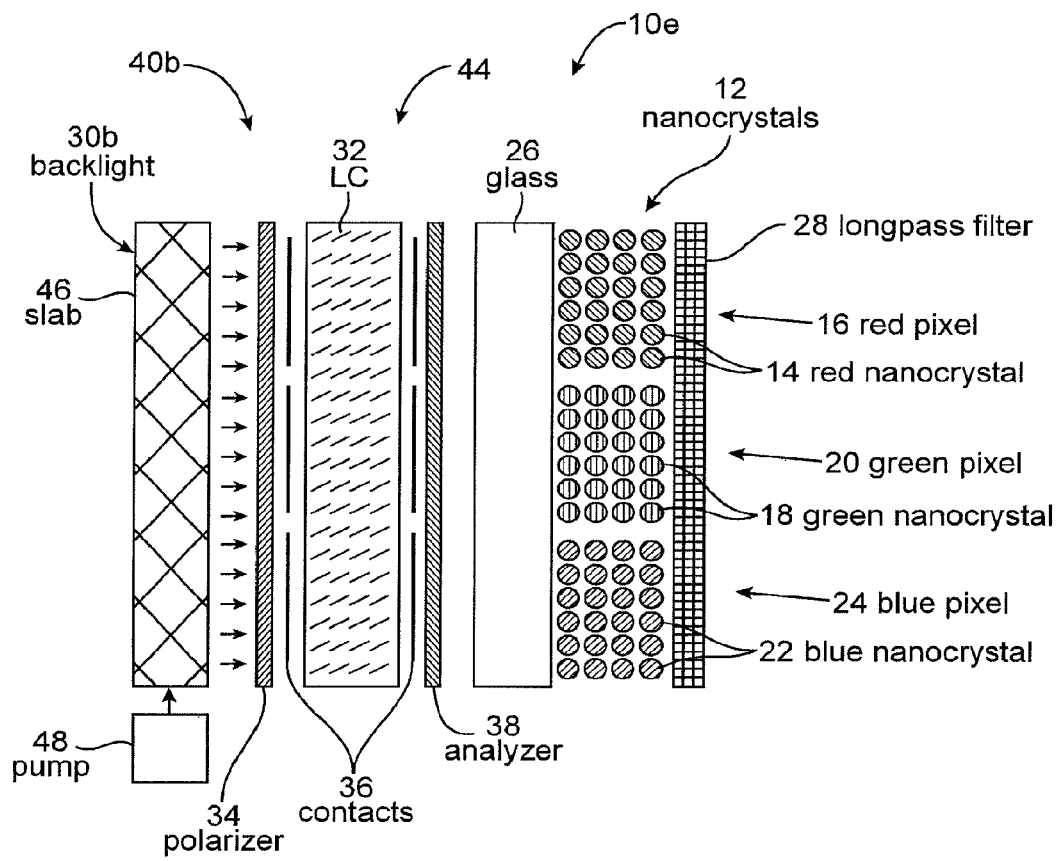
Figure 1F:
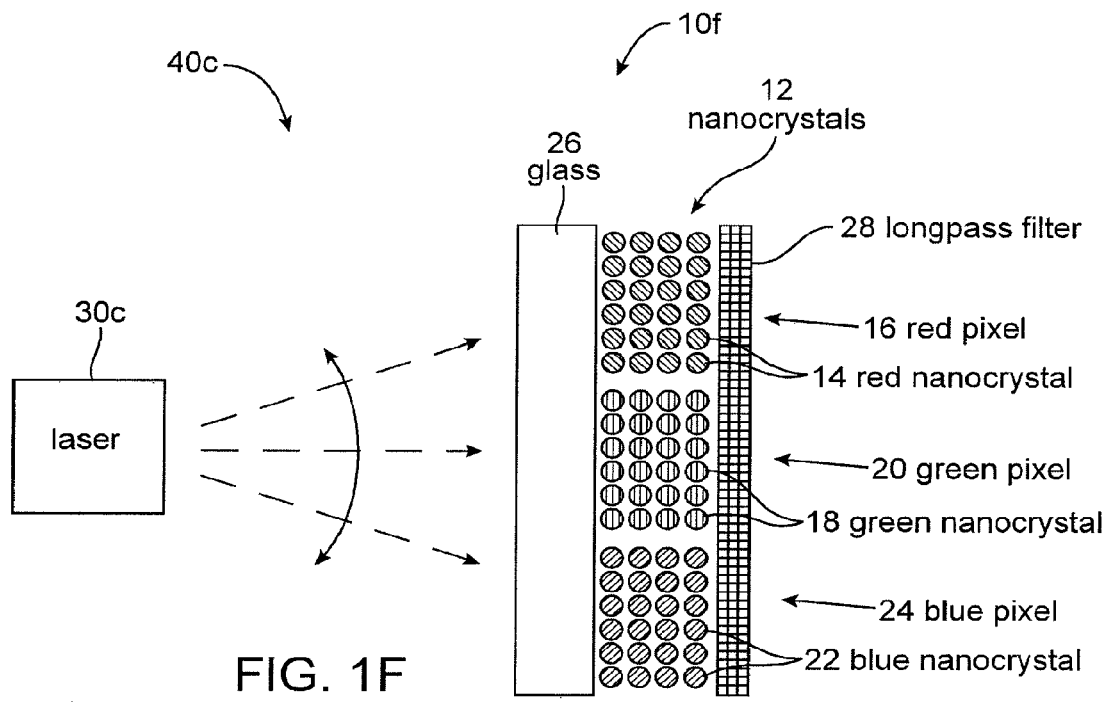

The display can be based on many different pixel addressing technologies. As used herein, the pixel addressing system includes both the excitation or optical pumping source and the means for addressing or exciting individual pixels in the array in a selected pattern. The modulation of the light for the display purpose can be achieved by direct modulation of a backlight source if it is pixelated and each pixel can be addressed and turned "on" and "off" by electronic means (FIGS. 1A-C, G). That will be the case, for example, for an array of individual UV/blue light emitting diodes (LEDs) or semiconductor lasers in the UV/blue region (based, for example, on GaN/InGaN technology) or a fabricated array of addressable two-dimensional LEDs or vertical cavity surface emitting lasers (VECSELs). The back light can also be modulated external to the source, as in the case of a liquid crystal display, where the backlight will be modulated when passing through the liquid crystal (FIGS. 1D-E). Pixels can also be addressed by a single modulated laser beam which is raster scanned across the display, similar to rastering an electron beam in a CRT (FIG. 1F).

Instead of using color filters as in conventional LCDs, the screen "dots" are made of luminescent semiconductor nanocrystals. Each R, G, or B pixel, for example, contains single-sized, very high quantum-yield, very stable, core-shell nanocrystals with a very narrow emission spectrum (approx. 20-40 nm) in the red, green or blue. The nanocrystals can be deposited on a glass or other transparent panel by various techniques, e.g. by direct printing by ink-jet technology, or by chemical bonding through specific glass and nanocrystal surface derivitization and patterning techniques, or by embedding nanocrystals in a polymer film and then patterning. Nanocrystals can also be dissolved in a liquid. Pixelation in this case is achieved by etching micro-wells into the panel and sealing individual size nanocrystals in solution into different wells. The concentration/optical density of nanocrystals in each dot is optimized such that the excitation light is efficiently absorbed to provide bright emission from the nanocrystals with minimal reabsorption.

Figure 1G:
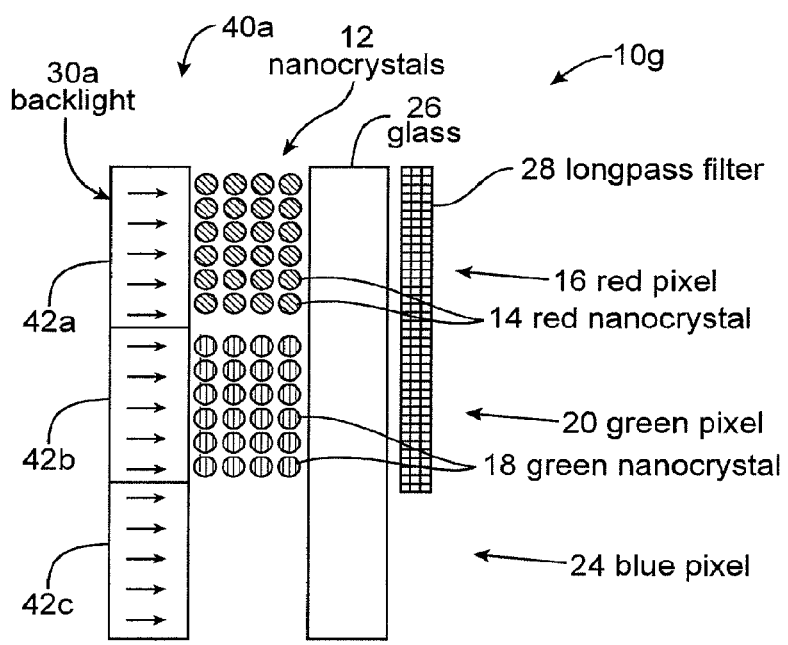

Illustrative embodiments of an optically pumped luminescent semiconductor nanocrystal based display (showing three pixels), with three different pixel addressing systems, are shown in FIGS. 1A-G. The electronic displays 10a-f of FIGS. 1A-F include a plurality or array 12 of nanocrystals 14, 18, 22 which form a plurality of pixels 16, 20, 24 of different colors. As shown the plurality or array 12 of nanocrystals include a group of red light emitting nanocrystals 14 which form a red pixel 16, a group of green light emitting nanocrystals 18 which form a green pixel 20, and a group of blue light emitting nanocrystals 22, which form a blue pixel 24. Display 10g of FIG. 1G has a blue pixel 24 without nanocrystals. While an electronic display based on the three primary colors RGB is illustrated, the nanocrystal approach provides great flexibility in using virtually any number of different of colors since the colors can easily be obtained by selecting the proper sized nanocrystals to produce a desired color. The nanocrystal array 12 may be sandwiched between a glass or other transparent plate 26 and long-pass filter 28 (FIG. 1A, D, E, F). The nanocrystals can be deposited, as solids or even in a liquid medium, on glass panel 26 in a number of different ways, including but not limited to the exemplary techniques described above. Alternately, the nanocrystal array 12 and plate 26 can be reversed (FIG. 1B, G), or plate 26 can be omitted (FIG. 1C), or filter 28 can be omitted (FIG. 1G).

While the nanocrystal array 12 is similar in the display embodiments 10a-g of FIGS. 1A-G, the pixel addressing systems (including optical pumping sources) 40a-c are of three different types. In FIG. 1A, backlight source 30a is formed of a plurality or array of addressable or individually and independently operable source elements 42a, b, c which correspond to an associated pixel 16, 20, 24 respectively. The source elements 42a, b, c are typically UV or blue LEDs or semiconductor lasers (the schematic representations include associated electronics). As source elements 42a, b, c are turned on and off, the associated pixels 16, 20, 24 are turned on and off, producing a color display. To avoid diffraction effects, backlight source 30a should be as close to nanocrystal array as possible, i.e. contacting panel 26 (distance D=0).

Variations in displays using addressing system 40a are shown in FIG. 1B, C. In FIG. 1A, backlight source 30a is separated from nanocrystal array 12 by plate 26. In order to get array 12 even closer to source 30a to reduce diffraction effects, array 12 and plate 26 can be reversed, as shown in FIG. 1B. Display 10b has array 12 deposited on plate 26, but backlight source 30a is up against the array 12 side of plate 26 instead of the opposite side. Since array 12 is in contact with backlight source 30a, it may be possible to deposit array 12 directly on source 30a, and omit plate 26 altogether, to from display 10c, as shown in FIG. 1C.

In FIG. 1D, display 10d has an addressing system 40b in which backlight source 30b is a single source. Light from backlight source 30b is modulated by a liquid crystal modulator 44 positioned between source 30b and nanocrystal array 12. Light from backlight source 30b, which is typically an ultraviolet or blue light source, passes through polarizer 34 into the liquid crystal 32. Liquid crystal 32 is modulated by electrical signals applied on contacts 36 on opposed faces thereof, to produce the appropriate patterns of excitation signals to excite the nanocrystal array 12. The modulated excitation light from the liquid crystal 32 passes through an analyzer 38 which is a polarizer with its axis orthogonal to that of polarizer 34 and through glass plate 26 into the nanocrystal array 12. When the part of liquid crystal 32 which corresponds to a pixel is off, light passing through polarizer 34 is blocked by analyzer 38. When the liquid crystal 32 is turned on, the liquid crystal rotates the polarization of the light passing through so that the light is passed by analyzer 38 to array 12 to excite the pixel. If source 30b is polarized, then polarizer 34 can be omitted. The position of array 12 and plate 26 can also be reversed as in FIG. 1B. FIG. 1E shows a display 10e which is similar to 10d. Backlight 30b is a slab or waveguide 46 which is end pumped by pump source 48 and emits light along a lateral side.

In FIG. 1F, the optical pumping source (addressing system) 40c of display 10f is a single laser 30c which can be modulated and raster scanned across the nanocrystal array 12. Thus as the output beam of laser 30c sweeps across the nanocrystal array 12 in a pattern, the output beam is turned on and off depending on whether a particular pixel 16, 20, 24 is to be on or off during that particular scanning cycle.

Figure 2A:
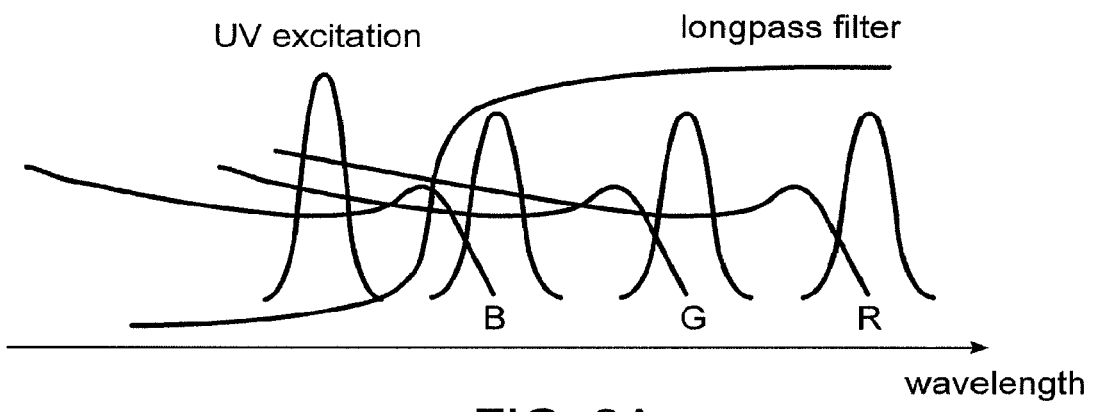
FIG. 2A illustrates one excitation scheme based on UV excitation.
Figure 2B:
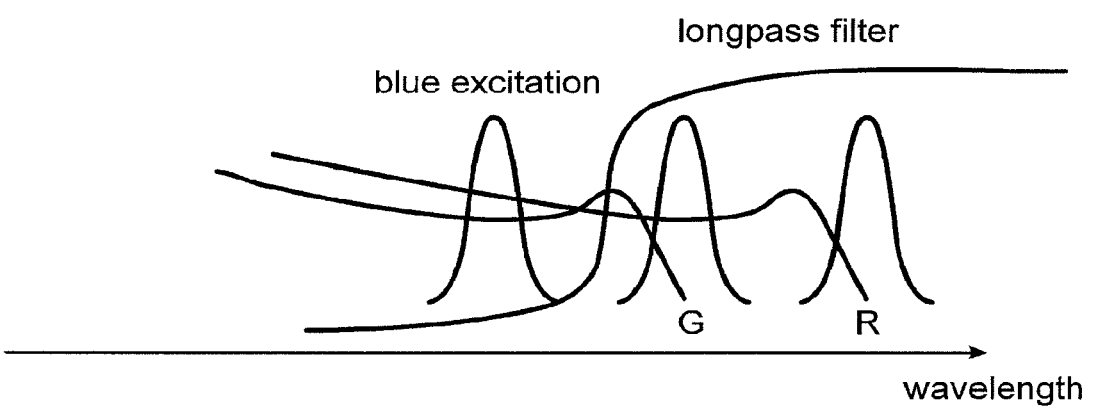
FIG. 2B illustrates an alternate excitation scheme based on blue excitation.

FIG. 1G shows a display 10g which is similar to display 10b, but which utilizes the excitation scheme of FIG. 2B. Blue pixel 24 is formed as an open space without nanocrystals and passes blue light from source 30a. No filter 28 is required over the blue pixels.

Although illustrated with these three optical pumping systems, various other optical pumping schemes can also be used. Any color excitation light source can be used. The only requirement is that the light source have higher photon energy compared to the color of the display. An infra-red (IR) display could be produced.

Various backlight excitation schemes can also be used, e.g. as illustrated in FIG. 2A, B. If UV backlight excitation is used (scheme A, FIG. 2A), all 3 RGB pixels contain the appropriate size nanocrystals. If blue excitation is used (scheme B, FIG. 2B) the blue pixel will contain no nanocrystals and pass the backlight directly (FIG. 1G). In scheme A, a long-pass filter with the appropriate cut-off wavelength (pass RGB but not UV excitation light) will pass the emitted light from the nanocrystals and block unwanted excitation light from passing through. In this case the filter will cover all pixels. In scheme B an appropriate long pass filter (pass RG but not blue light) will be implemented only for green and red pixels (no filter for blue pixels). If the optimal optical density is large enough (OD about 2), no filters are needed because the backlight will be entirely absorbed by the nanocrystals.

This invention makes very efficient use of the backlight since the photo-luminescence quantum efficiency is very high and there are no absorbing filters. Optical pumping of nanocrystals is much superior to electrical pumping (electroluminescence) and should provide for very efficient, bright and vivid colors. The spectral purity of the emission and ability to control the color of emission allows the display to span the whole chromaticity diagram and therefore obtain any desired color with high quality.

In the case of a liquid crystal display implementation, the use of polarized UV/blue laser backlight can eliminate one of the sheet polarizers, making the device even more efficient.

Other advantages of optically-pumped nanocrystal based displays are in: (1) the ease and simplicity of fabrication; (2) they can be used for flexible and large area displays; (3) they are compatible with very high resolution displays (especially when pumped with UV/blue light); (4) high extinction coefficients can be achieved with thin films; (5) very good size distribution will eliminate self absorption because of Stokes shift.

Changes and modifications in the specifically described embodiments can be carried out without departure from the scope of the invention which is intended to be limited only by the scope of the appended claims.

The invention claimed is:

1. A method for making a display apparatus, the method comprising:
providing an optical pumping source comprising one or more blue LED's;
placing a layer of quantum dots over said optical pumping source, said quantum dots emitting light in response to exposure to light from said optical pumping source; and
placing a transparent plate over said layer of quantum dots such that said layer of quantum dots is positioned between said optical pumping source and said transparent plate.

2. The method of claim 1 wherein the method further comprises:
prior to placing said layer of quantum dots over said optical pumping source, placing a liquid crystal modulator over said optical pumping source such that subsequent to placing said layer of quantum dots on said optical pumping source, said liquid crystal modulator is located between the optical pumping source and the layer of quantum dots.

3. The method of claim 2 wherein the method further comprises:
prior to placing said transparent plate over said layer of quantum dots, placing a long pass filter over said layer of quantum dots such that subsequent to placing said transparent plate on said layer of quantum dots, said long pass filter is located between layer of quantum dots and the transparent plate.

4. The method of claim 1 wherein the layer of quantum dots is in the form of a polymer film comprising a plurality of quantum dots embedded therein.

5. The method of claim 4, wherein the plurality of quantum dots comprises red-light emitting quantum dots and green-light emitting quantum dots.

6. The method of claim 5, wherein said quantum dots are core/shell nanocrystals.

7. The method of claim 6, wherein the cores of said quantum dots comprise CdSe.

8. The method of claim 6, wherein the cores of said quantum dots comprise InP.

9. The method of claim 7, wherein the shells of said quantum dots comprise CdS.

10. The method of claim 4, wherein the plurality of quantum dots consists of red-light emitting quantum dots and green-light emitting quantum dots.

11. The method of claim 10, wherein said quantum dots are core/shell nanocrystals.

12. The method of claim 11, wherein the cores of said quantum dots comprise CdSe.

13. The method of claim 11, wherein the cores of said quantum dots comprise InP.

14. The method of claim 12, wherein the shells of said quantum dots comprise CdS.

15. A method for making a color display apparatus, the method comprising:
providing an optical pumping source;
placing a layer of quantum dots over said optical pumping source, said quantum dots emitting light in response to exposure to light from said optical pumping source; and
placing a transparent plate over said layer of quantum dots such that said layer of quantum dots is positioned between said optical pumping source and said transparent plate,
wherein said color display apparatus is configured to display dynamic color images.

16. The method of claim 15 wherein the method further comprises:
prior to placing said layer of quantum dots over said optical pumping source, placing a liquid crystal modulator over said optical pumping source such that subsequent to placing said layer of quantum dots on said optical pumping source, said liquid crystal modulator is located between the optical pumping source and the layer of quantum dots.

17. The method of claim 16 wherein the method further comprises:
   prior to placing said transparent plate over said layer of quantum dots, placing a long pass filter over said layer of quantum dots such that subsequent to placing said transparent plate on said layer of quantum dots, said long pass filter is located between layer of quantum dots and the transparent plate.

18. The method of claim 15 wherein the layer of quantum dots is in the form of a polymer film comprising a plurality of quantum dots embedded therein.

19. The method of claim 18, wherein the plurality of quantum dots comprises red-light emitting quantum dots and green-light emitting quantum dots.

20. The method of claim 19, wherein said quantum dots are core/shell nanocrystals.

21. The method of claim 20, wherein the cores of said quantum dots comprise CdSe.

22. The method of claim 20, wherein the cores of said quantum dots comprise InP.

23. The method of claim 21, wherein the shells of said quantum dots comprise CdS.

24. The method of claim 18, wherein the plurality of quantum dots consists of red-light emitting quantum dots and green-light emitting quantum dots.

25. The method of claim 24, wherein said quantum dots are core/shell nanocrystals.

26. The method of claim 25, wherein the cores of said quantum dots comprise CdSe.

27. The method of claim 25, wherein the cores of said quantum dots comprise InP.

28. The method of claim 26, wherein the shells of said quantum dots comprise CdS.

* * * * *